(12) United States Patent
Kato et al.

(10) Patent No.: US 10,916,491 B2
(45) Date of Patent: Feb. 9, 2021

(54) SEMICONDUCTOR MODULE

(71) Applicant: FUJI ELECTRIC CO., LTD., Kawasaki (JP)

(72) Inventors: Ryoichi Kato, Matsumoto (JP); Kohei Yamauchi, Matsumoto (JP); Hiromichi Gohara, Matsumoto (JP); Tatsuhiko Asai, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/120,754

(22) Filed: Sep. 4, 2018

(65) Prior Publication Data

US 2019/0088575 A1    Mar. 21, 2019

(30) Foreign Application Priority Data

Sep. 15, 2017   (JP) .................................. 2017-178194

(51) Int. Cl.
*H01L 23/495* (2006.01)
*H01L 23/492* (2006.01)
(Continued)

(52) U.S. Cl.
CPC ...... *H01L 23/49562* (2013.01); *H01L 23/041* (2013.01); *H01L 23/24* (2013.01);
(Continued)

(58) Field of Classification Search
CPC ..... H01L 2924/014; H01L 2924/01047; H01L 2924/01029; H01L 2924/01051;
(Continued)

(56) References Cited

U.S. PATENT DOCUMENTS

2003/0189817 A1*   10/2003   Yoshii .................... H01G 2/065
                                                        361/773
2011/0089568 A1*    4/2011   Nishibori ................ H01L 24/83
                                                        257/772

(Continued)

FOREIGN PATENT DOCUMENTS

JP        2006-287064 A    10/2006
JP        4730181 B2         7/2011

*Primary Examiner* — Marcos D. Pizarro
*Assistant Examiner* — Quinton A Brasfield

(57) ABSTRACT

A semiconductor module includes a semiconductor element having one and the other surface, a lead terminal connected electrically and thermally to the semiconductor element, a first solder which bonds the lead terminal and the one surface of the semiconductor element together, a circuit layer over which the semiconductor element is disposed and a second solder which bonds the other surface of the semiconductor element and the circuit layer together. The inequality $$(A/B)<1$$

holds, where A and B are the tensile strength of the first and second solder, respectively. As a result, even if the lead terminal which thermally expands because of heat generated by the semiconductor element expands or contracts toward the semiconductor element, a stress applied by the lead terminal is absorbed and relaxed by the first solder. This prevents damage to the surface electrode of the semiconductor element by suppressing the occurrence of cracks.

15 Claims, 8 Drawing Sheets

(51) Int. Cl.
  *H01L 23/367*  (2006.01)
  *H01L 23/00*  (2006.01)
  *H01L 29/739*  (2006.01)
  *H01L 23/36*  (2006.01)
  *H01L 23/498*  (2006.01)
  *H01L 23/04*  (2006.01)
  *H01L 23/373*  (2006.01)
  *H01L 23/24*  (2006.01)

(52) U.S. Cl.
  CPC ............ *H01L 23/36* (2013.01); *H01L 23/367* (2013.01); *H01L 23/3735* (2013.01); *H01L 23/3737* (2013.01); *H01L 23/492* (2013.01); *H01L 23/49844* (2013.01); *H01L 24/29* (2013.01); *H01L 24/69* (2013.01); *H01L 24/84* (2013.01); *H01L 29/7393* (2013.01); *H01L 24/32* (2013.01); *H01L 24/37* (2013.01); *H01L 24/40* (2013.01); *H01L 24/73* (2013.01); *H01L 29/7395* (2013.01); *H01L 2224/29111* (2013.01); *H01L 2224/32225* (2013.01); *H01L 2224/3716* (2013.01); *H01L 2224/37124* (2013.01); *H01L 2224/37139* (2013.01); *H01L 2224/37147* (2013.01); *H01L 2224/40095* (2013.01); *H01L 2224/40225* (2013.01); *H01L 2224/73263* (2013.01); *H01L 2224/83801* (2013.01); *H01L 2224/84801* (2013.01); *H01L 2924/014* (2013.01); *H01L 2924/0105* (2013.01); *H01L 2924/01029* (2013.01); *H01L 2924/01051* (2013.01); *H01L 2924/13055* (2013.01); *H01L 2924/13091* (2013.01)

(58) Field of Classification Search
  CPC . H01L 2224/29111; H01L 2224/13111; H01L 2224/29311; H01L 2924/013
  See application file for complete search history.

(56) References Cited

U.S. PATENT DOCUMENTS

| | | | |
|---|---|---|---|
| 2016/0343641 A1* | 11/2016 | Hori | H01L 24/11 |
| 2017/0012018 A1* | 1/2017 | Watanabe | H01L 25/07 |
| 2017/0278770 A1* | 9/2017 | Kato | H01L 23/3677 |
| 2017/0309544 A1* | 10/2017 | Kobayashi | H01L 23/4334 |

* cited by examiner

| | FIRST SOLDER | SECOND SOLDER | TENSILE STRENGTH RATIO (25°C) | TENSILE STRENGTH RATIO (125°C) | YOUNG'S MODULUS RATIO (25°C) |
|---|---|---|---|---|---|
| PRACTICAL EXAMPLE 1 | Sn10Sb | Sn11Sb | 0.94 | 0.92 | 0.96 |
| PRACTICAL EXAMPLE 2 | Sn11Sb | Sn13Sb | 0.89 | 0.82 | 0.99 |
| PRACTICAL EXAMPLE 3 | Sn3Sb | Sn5Sb | 0.82 | 0.69 | 0.97 |
| PRACTICAL EXAMPLE 4 | Sn5Sb | Sn8Sb | 0.78 | 0.79 | 0.99 |
| PRACTICAL EXAMPLE 5 | Sn8Sb | Sn13Sb | 0.73 | 0.55 | 0.96 |
| PRACTICAL EXAMPLE 6 | Sn0.7Cu | Sn5Sb | 0.63 | 0.70 | 1.01 |
| PRACTICAL EXAMPLE 7 | Sn3Sb | Sn13Sb | 0.47 | 0.31 | 0.93 |
| PRACTICAL EXAMPLE 8 | Sn0.7Sb | Sn15Sb | 0.33 | 0.27 | 0.96 |
| REFERENCE EXAMPLE 9 | Sn0.7Cu | Sn0.7Cu | 1 | 1 | 1 |
| REFERENCE EXAMPLE 10 | Sn5Sb | Sn5Sb | 1 | 1 | 1 |
| REFERENCE EXAMPLE 11 | Sn8Sb | Sn8Sb | 1 | 1 | 1 |
| REFERENCE EXAMPLE 12 | Sn13Sb | Sn8Sb | 1.36 | 1.53 | 1.04 |

FIG. 6

| | FIRST SOLDER | TENSILE STRENGTH (MPa) | SECOND SOLDER | TENSILE STRENGTH (MPa) | POWER CYCLE LIFE |
|---|---|---|---|---|---|
| PRACTICAL EXAMPLE 1 | Sn10Sb | 42.7 | Sn11Sb | 45.4 | 200 |
| PRACTICAL EXAMPLE 2 | Sn11Sb | 45.4 | Sn13Sb | 50.8 | 200 |
| PRACTICAL EXAMPLE 3 | Sn3Sb | 23.8 | Sn5Sb | 29.2 | 380 |
| PRACTICAL EXAMPLE 4 | Sn5Sb | 29.2 | Sn8Sb | 37.4 | 390 |
| PRACTICAL EXAMPLE 5 | Sn8Sb | 37.3 | Sn13Sb | 50.8 | 450 |
| PRACTICAL EXAMPLE 6 | Sn0.7Cu | 18.5 | Sn5Sb | 29.2 | 450 |
| PRACTICAL EXAMPLE 7 | Sn3Sb | 23.8 | Sn13Sb | 50.8 | 500 |
| PRACTICAL EXAMPLE 8 | Sn3Sb | 18.5 | Sn15Sb | 56.8 | 350 |
| REFERENCE EXAMPLE 9 | Sn0.7Cu | 18.5 | Sn0.7Cu | 18.5 | 100 |
| REFERENCE EXAMPLE 10 | Sn5Sb | 29.2 | Sn5Sb | 29.2 | 80 |
| REFERENCE EXAMPLE 11 | Sn8Sb | 37.4 | Sn8Sb | 37.4 | 70 |
| REFERENCE EXAMPLE 12 | Sn13Sb | 50.8 | Sn8Sb | 37.4 | 50 |

FIG. 8

SEMICONDUCTOR MODULE

CROSS-REFERENCE TO RELATED APPLICATION

This application is based upon and claims the benefit of priority of the prior Japanese Patent Application No. 2017-178194, filed on Sep. 15, 2017, the entire contents of which are incorporated herein by reference.

BACKGROUND

1. Field

The embodiment discussed herein is related to a semiconductor module using a power semiconductor element which controls a high current and a high voltage.

2. Related Art

A semiconductor module includes a plurality of power semiconductor elements and is used as, for example, a power conversion element of an inverter unit. A power semiconductor element is a metal oxide semiconductor field effect transistor (MOSFET), an insulated gate bipolar transistor (IGBT), a freewheeling diode (FWD), or the like. Furthermore, a power semiconductor element is a reverse conducting (RC)-IGBT obtained by integrating an IGBT and an FWD, a reverse blocking (RB)-IGBT having a sufficient breakdown voltage against a reverse bias, or the like.

In such a semiconductor module, an electrode on the back surface of a semiconductor element is bonded to a laminated board by the use of solder and an electrode on the front surface of the semiconductor element through which a principal current flows is bonded to a conductor for a wiring by the use of solder. The laminated board is formed by disposing a conductive plate made of copper or the like on the front surface and/or the back surface of an insulating board such as a ceramic board. It is known that the solder used on the back surface of the semiconductor element differs from the solder used on the front surface of the semiconductor element in physical property (see, for example, Japanese Patent No. 4730181).

According to Japanese Patent No. 4730181, for example, a semiconductor element is sandwiched between two conductive members. Furthermore, at solder reflow time the solidifying point of solder under the semiconductor element is made lower than that of solder over the semiconductor element.

When a MOS-type or IGBT-type semiconductor element referred to as a power semiconductor element operates, it generates heat and reaches a high temperature. In recent years, there has been a growing demand for high-current power semiconductor elements and there has been a tendency for the amount of heat generated by semiconductor elements to increase. Furthermore, there is need for a growing number of semiconductor elements, such as in-vehicle power semiconductor elements, to operate at a usage environment temperature higher than 175° C. The upper and lower surfaces of a semiconductor element which repeats heat generation and cooling are bonded by the use of solder. Accordingly, when the semiconductor element repeatedly generates heat, a strain is repeatedly induced in the solder and the solder deteriorates. As a result, peeling may occur because of a crack at a solder bonding interface.

In addition, a solder is used for bonding a semiconductor element to a laminated board, which is its support, and a lead terminal, which is an external connection terminal. Furthermore, these semiconductor element, laminated board, and lead terminal are sealed by the use of epoxy resin or the like.

With such a semiconductor module a lead terminal thermally expands because of heat generated by a semiconductor element. At this time the lead terminal is pressed by resin for sealing. As a result, the lead terminal expands toward the thin semiconductor element. Accordingly, a great stress is applied to the semiconductor element by the lead terminal. This may cause a crack in a surface electrode of the semiconductor element, resulting in damage.

SUMMARY

According to an aspect, there is provided a semiconductor module including: a semiconductor element having one surface and another surface opposite to the one surface; an external connection terminal connected electrically and thermally to the semiconductor element; a first solder which bonds the external connection terminal and the one surface of the semiconductor element together; a metal substrate over which the semiconductor element is disposed; and a second solder which bonds the other surface of the semiconductor element and the metal substrate together, wherein tensile strength ratio<1, where a tensile strength of the first solder is A, a tensile strength of the second solder is B, and the tensile strength ratio is A/B.

Additional aspects and/or advantages will be set forth in part in the description which follows and, in part, will be apparent from the description, or may be learned by practice of the claimed invention.

It is to be understood that both the foregoing general description and the following description of embodiments provide illustrative examples and explanations and are not restrictive of the claimed invention.

BRIEF DESCRIPTION OF THE DRAWINGS

FIG. 6 illustrates examples of the types of solders applied to the semiconductor module according to the embodiment;

FIG. 8 illustrates the result of power cycle tests regarding the tensile strength of the solders applied to the semiconductor module according to the embodiment.

DESCRIPTION OF EMBODIMENTS

An embodiment will now be described in detail with reference to the accompanying drawings.

In the following description, the same or equivalent components are marked with the same numerals and detailed descriptions of them will be omitted.

Furthermore, the present disclosure is not limited to the following embodiment. Proper modifications may be made to the embodiment within a scope in which the gist is not changed.

A semiconductor module according to an embodiment will be described by the use of FIGS. 1 through 3.

Figure 1:
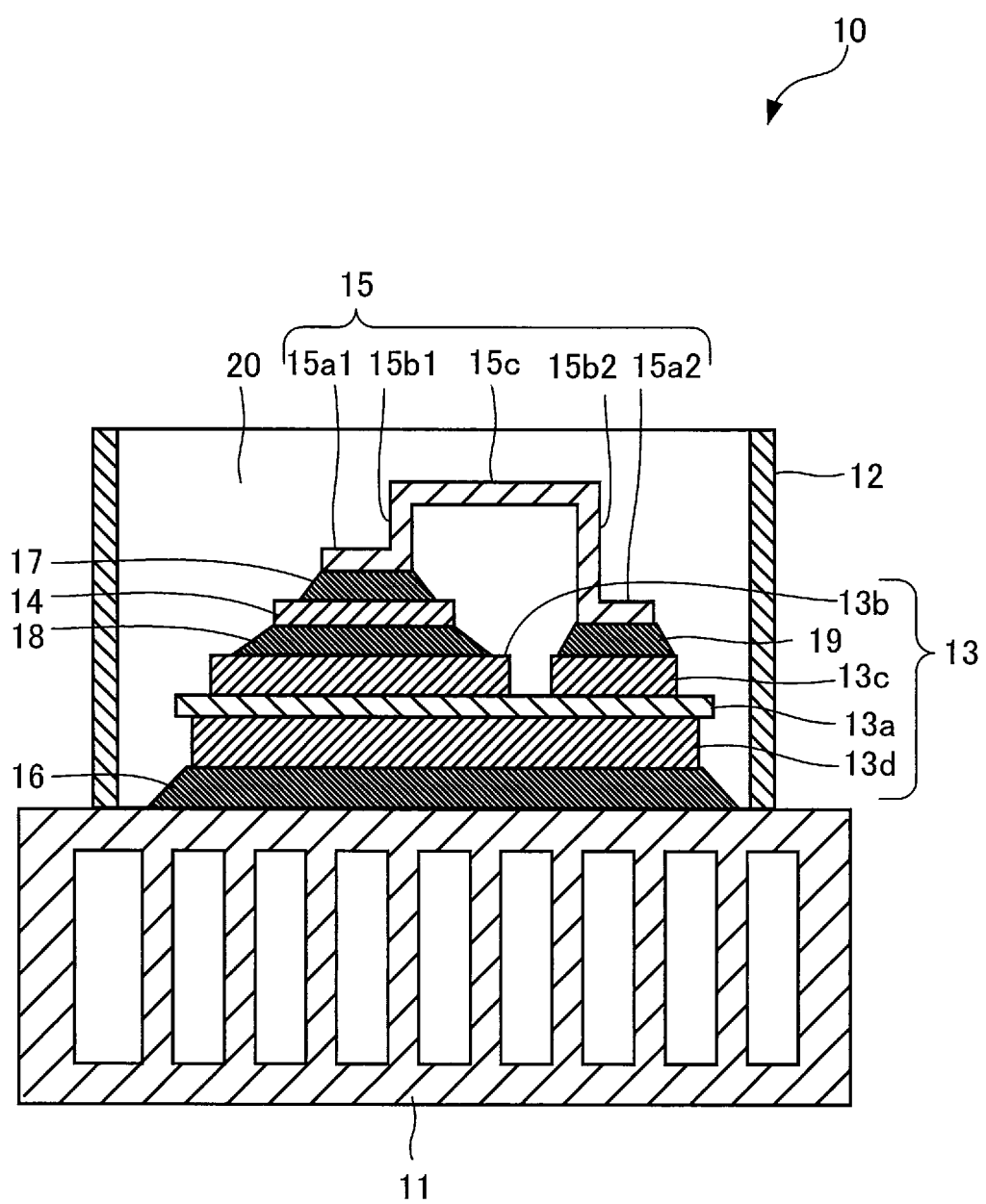
FIG. 1 illustrates an example of a semiconductor module according to an embodiment.

FIG. 1 illustrates an example of a semiconductor module according to an embodiment.

Figure 2A:
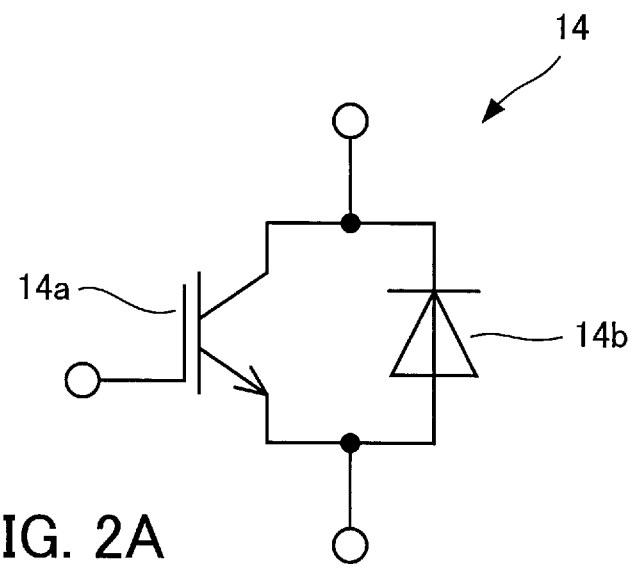
FIGS. 2A and 2B illustrate an example of a semiconductor element.
Figure 2B:
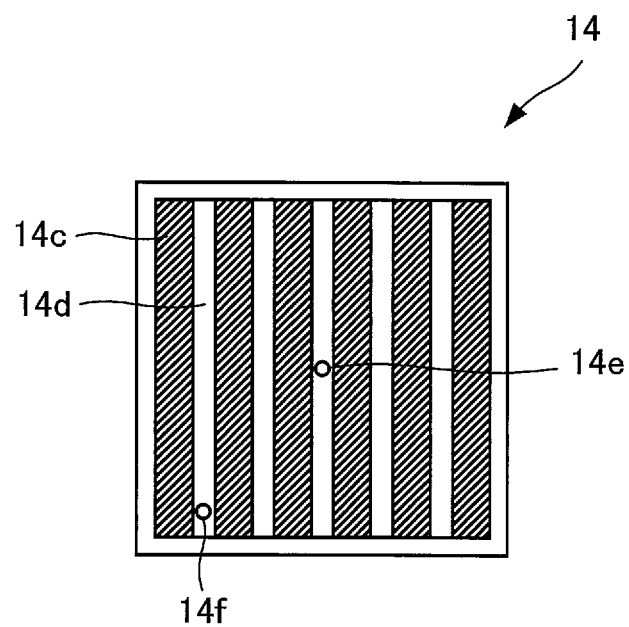

FIGS. 2A and 2B illustrate an example of a semiconductor element. FIG. 2A is a circuit diagram of an RC-IGBT which is a semiconductor element. FIG. 2B is a plan view of the RC-IGBT which is a semiconductor element.

Figure 3:
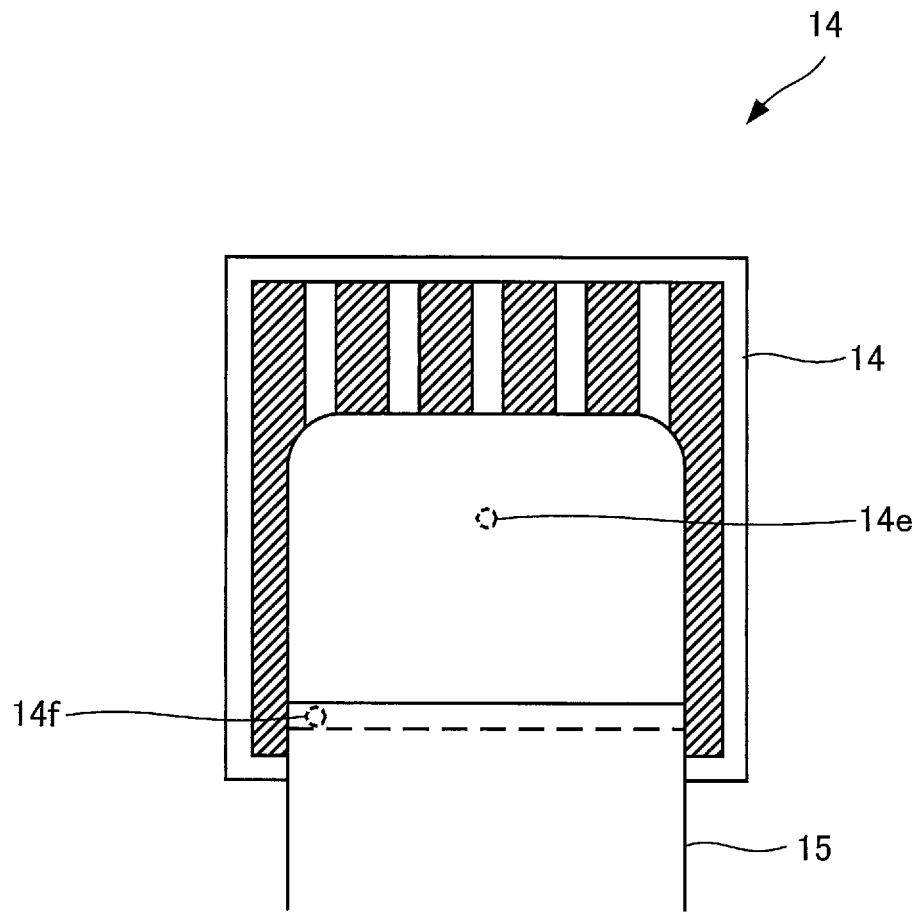
FIG. 3 is a plan view illustrative of a state in which the semiconductor element and a lead terminal are bonded together.

FIG. 3 is a plan view illustrative of a state in which the semiconductor element and a lead terminal are bonded together.

As illustrated in FIG. 1, a semiconductor module 10 includes a laminated board 13 and a semiconductor element 14 disposed over the laminated board 13 with a second solder 18 therebetween. Furthermore, the semiconductor module 10 includes a lead terminal 15 bonded to the semiconductor element 14 with a first solder 17 therebetween and bonded to the laminated board 13 with a solder 19 situated under the lead terminal 15 therebetween. The semiconductor module 10 may include a case 12 which houses a cooler 11, the laminated board 13 placed over the cooler 11 with a solder 16 situated under the laminated board 13 therebetween, the semiconductor element 14, and the lead terminal 15.

The cooler 11 is made of metal, such as aluminum, iron, silver, copper, or an alloy containing at least one of them, having a good heat conduction property. A cavity is formed inside the cooler 11 and a plurality of fins are disposed in the cavity. There is a passage for a refrigerant between fins. A liquid medium, such as an aqueous solution of ethylene glycol or water, may be used as such a refrigerant. In addition, a gas medium, such as air, may be used as such a refrigerant. Furthermore, a refrigerant, such as chlorofluorocarbon, which is evaporated and vaporized in the cooler 11 for cooling and whose phase is changeable may be used. Moreover, in order to improve corrosion resistance, a material, such as nickel, may be formed over the surface of the cooler 11 by plating treatment or the like. To be concrete, an alloy of nickel and phosphorus, an alloy of nickel and boron, or the like may be used in place of nickel. The cooler 11 adopts the above cooling system. However, the cooler 11 may be a self-cooled or air-cooled cooler.

The laminated board 13 includes an insulating board 13a, circuit layers 13b and 13c formed over a front surface of the insulating board 13a, and a metal plate 13d formed over a back surface of the insulating board 13a. Each of the circuit layers 13b and 13c is an example of a metal substrate.

The insulating board 13a is made of a ceramic, such as aluminum oxide, aluminum nitride, or silicon nitride, having a high heat conduction property. The insulating board 13a has, for example, a rectangular shape in planar view.

The circuit layers 13b and 13c each of which is an example of a metal substrate are made of a metal material having good conductivity and solder wettability. Silver, copper, an alloy containing at least one of them, or the like is used as such a material. In addition, plating treatment may be performed on the circuit layers 13b and 13c by the use of a material having good corrosion resistance. Aluminum, nickel, titanium, chromium, molybdenum, tantalum, niobium, tungsten, vanadium, bismuth, zirconium, hafnium, gold, platinum, palladium, an alloy containing at least one of them, or the like is used as such a material.

The metal plate 13d is made of metal, such as aluminum, iron, silver, copper, or an alloy containing at least one of them, having a good heat conduction property. Furthermore, the metal plate 13d has a rectangular shape in planar view and its area is smaller than that of the insulating board 13a.

For example, a direct copper bonding (DCB) board or an active metal brazed (AMB) board may be used as the laminated board 13 having the above structure. The laminated board 13 conducts heat generated by the semiconductor element 14 to the cooler 11 via the circuit layer 13b, the insulating board 13a, and the metal plate 13d.

The solder 16 situated under the laminated board 13 connects the laminated board 13 and the cooler 11 thermally and mechanically. It is desirable to use a high-strength solder as the solder 16 situated under the laminated board 13 for realizing high reliability. For example, a tin (Sn)-antimony (Sb) based solder or Sn—Sb-silver (Ag) based solder is used.

The semiconductor element 14 in this embodiment is an RC-IGBT. As illustrated in FIG. 2A, the RC-IGBT is obtained by integrating an IGBT 14a and a freewheeling diode (FWD) 14b. That is to say, the RC-IGBT has a structure in which the IGBT 14a and the FWD 14b are connected in inverse parallel. A collector terminal of the IGBT 14a is connected to a cathode terminal of the FWD 14b to form a surface electrode over a back surface of the semiconductor element 14. The surface electrode on the back surface of the semiconductor element 14 is bonded to the circuit layer 13b by the second solder 18. A silicon semiconductor and a wide band-gap semiconductor, such as silicon carbide, may be used for forming the semiconductor element 14.

Furthermore, an emitter terminal of the IGBT 14a is connected to an anode terminal of the FWD 14b in this RC-IGBT to form a surface electrode over a front surface of the semiconductor element 14. As illustrated in FIG. 2B, the RC-IGBT has a structure in which a plurality of IGBT areas 14c and a plurality of FWD areas 14d are disposed alternately to form a striped pattern. The RC-IGBT has the surface electrode (not illustrated in FIG. 2B) connected to the emitter terminal of the IGBT 14a in the plurality of IGBT areas 14c and the anode terminal of the FWD 14b in the plurality of FWD areas 14d. In addition, there is a control surface electrode over the front surface of the semiconductor element 14 connected to a gate terminal of the IGBT 14a. Furthermore, temperature sensors 14e and 14f may be integrated into central and peripheral portions, respectively, of the semiconductor element 14.

The second solder 18 connects the semiconductor element 14 and the circuit layer 13b electrically and thermally. In order to bond together the semiconductor element 14 and the circuit layer 13b comparatively firmly, it is desirable to use a high-strength solder as the second solder 18 compared with the first solder 17 which will be described later and as which an Sn—Sb based solder, an Sn—Ag—Cu based solder, or the like is used.

It is desirable to use as an Sn—Sb based solder a solder which contains 0.1 to 15 wt % Sb, Sn, and inevitable impurities. If the Sb content of a solder is lower than 0.1 wt %, then a crack tends to appear in the solder. As a result, there is a strong possibility that reliability needed is not secured. If the Sb content of a solder is higher than 15 wt %, then soldering temperature exceeds 300° C. As a result, an increase in failure rate caused by the crystallization of a peripheral nickel film is feared. Furthermore, it is desirable that the Sb content of a solder be higher than or equal to 2.8 wt % and lower than or equal to 13 wt %. If the Sb content of a solder is higher than or equal to 2.8 wt %, then it is easy to improve the reliability of the semiconductor module 10.

One end of the lead terminal 15 is bonded to the surface electrode, such as the emitter terminal, over the front surface of the semiconductor element 14 by the first solder 17. The other end of the lead terminal 15 is bonded to the circuit layer 13c of the laminated board 13 by the solder 19 situated under the lead terminal 15. The solder 19 situated under the lead terminal 15 connects the lead terminal 15 and the circuit layer 13c electrically and thermally. In order to bond together the lead terminal 15 and the circuit layer 13c comparatively firmly, a solder which is the same as the second solder 18 or which contains the same elements as the second solder 18 contains is used as the solder 19 situated under the lead terminal 15.

The bonding area between the lead terminal 15 and the semiconductor element 14 is larger than or equal to 20 percent and smaller than or equal to 70 percent of the bonding area between the semiconductor element 14 and the laminated board 13. If the bonding area between the lead terminal 15 and the semiconductor element 14 is in this range, then the amount of the first solder 17 is sufficient and a stress applied by an external terminal, such as the lead terminal 15, is relaxed.

The first solder 17 connects a lower surface of the lead terminal 15 and the surface electrode of the semiconductor element 14 electrically and thermally. Because the first solder 17 is used in a portion in which a strong stress is applied by the lead terminal 15 to the surface electrode of the semiconductor element 14, a solder whose tensile strength is lower than that of the second solder 18 is used as the first solder 17. For example, it is desirable that the first solder 17 be an Sn—Cu based solder or an Sn—Sb based solder. As a result, when the lead terminal 15 expands and contracts because of heat and stress is applied by the lead terminal 15 to the semiconductor element 14, the first solder 17 acts so as to absorb and relax the stress. Furthermore, even if thermal stress is applied by the first solder 17 to the surface electrode of the semiconductor element 14 because of thermal expansion and thermal contraction of the first solder 17, the thermal stress is relaxed. Therefore, a stress applied to the surface electrode over the front surface of the semiconductor element 14 is reduced and the reliability of the surface electrode of the semiconductor element 14 is improved.

The details of the first solder 17 and the second solder 18 will be described later.

The lead terminal 15 is an external connection terminal. A metal material having low electric resistance and high thermal conductivity is preferably used for making the lead terminal 15. To be concrete, the lead terminal 15 is made of metal, such as aluminum, iron, silver, copper, or an alloy containing at least one of them. In this embodiment, copper whose thermal expansion coefficient is lower than that of aluminum is used.

If the temperature sensor 14e is formed, then the lead terminal 15 is bonded to the semiconductor element 14 by the first solder 17, as illustrated in FIG. 3, so as to cover at least the temperature sensor 14e formed in the central portion of the semiconductor element 14.

The above lead terminal 15 is formed by bending a long and narrow copper plate. However, the shape of a terminal is not limited to a lead. A lead terminal may be used or a pin terminal may be used. The lead terminal 15 in this embodiment has a bonding portion 15a1 bonded by the first solder 17, a rising portion 15b1 formed by bending the end of the bonding portion 15a1 up in FIG. 1, and a horizontal portion 15c formed by bending the end of the rising portion 15b1 parallel with the surface of the semiconductor element 14. Furthermore, the lead terminal 15 has a rising portion 15b2 formed by bending the end of the horizontal portion 15c down in FIG. 1 and a bonding portion 15a2 bonded by the solder 19 situated under the lead terminal 15.

In addition, when the bonding portion 15a1 of the lead terminal 15 extends in the vertical or horizontal direction because of heat generated by the semiconductor element 14, a stress is applied to the first solder 17 and the surface electrode of the semiconductor element 14. If the lead terminal 15 is cramped by a sealing resin 20, then the stress becomes significant. A great stress is unfavorable. If this constraint and a manufacturing constraint at bending work time are taken into consideration, then it is desirable to set the lead terminal 15 to 0.3 to 1.5 mm in thickness.

In this embodiment, the lead terminal 15 is taken as an example of an external connection terminal. However, an external connection terminal is not limited to the lead terminal 15. A pin terminal may be used.

Of the components housed in the case 12, at least the lead terminal 15, the first solder 17, the semiconductor element 14, the second solder 18, the circuit layer 13b, and the insulating board 13a are sealed by the sealing resin 20. If the lead terminal 15 and the like are sealed by the sealing resin 20, then there is no need for the semiconductor module 10 to include the case 12.

The above case 12 has the shape of a box which covers the sides of the laminated board 13, and is made of a thermoplastic resin. Polyphenylene sulfide (PPS), polybutylene terephthalate (PBT) resin, polybutylene succinate (PBS) resin, polyamide (PA) resin, acrylonitrile butadiene styrene (ABS) resin, or the like is used as a thermoplastic resin. In addition, the above case 12 is bonded to the cooler 11 with an adhesive (not illustrated) therebetween.

It is desirable that the sealing resin 20 have determined insulation performance and good formability. Epoxy resin, maleimide resin, or the like is preferably used as the sealing resin 20. In addition, thermosetting resin, such as polyimide resin, isocyanate resin, amino resin, phenolic resin, or silicone-based resin, may be used as the sealing resin 20. Furthermore, the sealing resin 20 may contain an additive such as an inorganic filler.

The above semiconductor module 10 includes one set of the semiconductor element 14 and the lead terminal 15. However, the above semiconductor module 10 may include plural sets of a semiconductor element 14 and a lead terminal 15. Disposing a plurality of semiconductor elements 14 in parallel increases the rated output of the semiconductor module 10. Furthermore, if two semiconductor elements 14 are disposed in series, then the semiconductor module 10 having a half-bridge inverter circuit is formed. In addition, when a plurality of semiconductor elements 14 are disposed, the semiconductor elements 14 of different types may be used at need.

A solder material applied to each of the first solder 17 and the second solder 18 used in the above semiconductor module 10 will now be described.

First the tensile strength and the like of a solder will be described by the use of FIG. 4.

Figure 4:
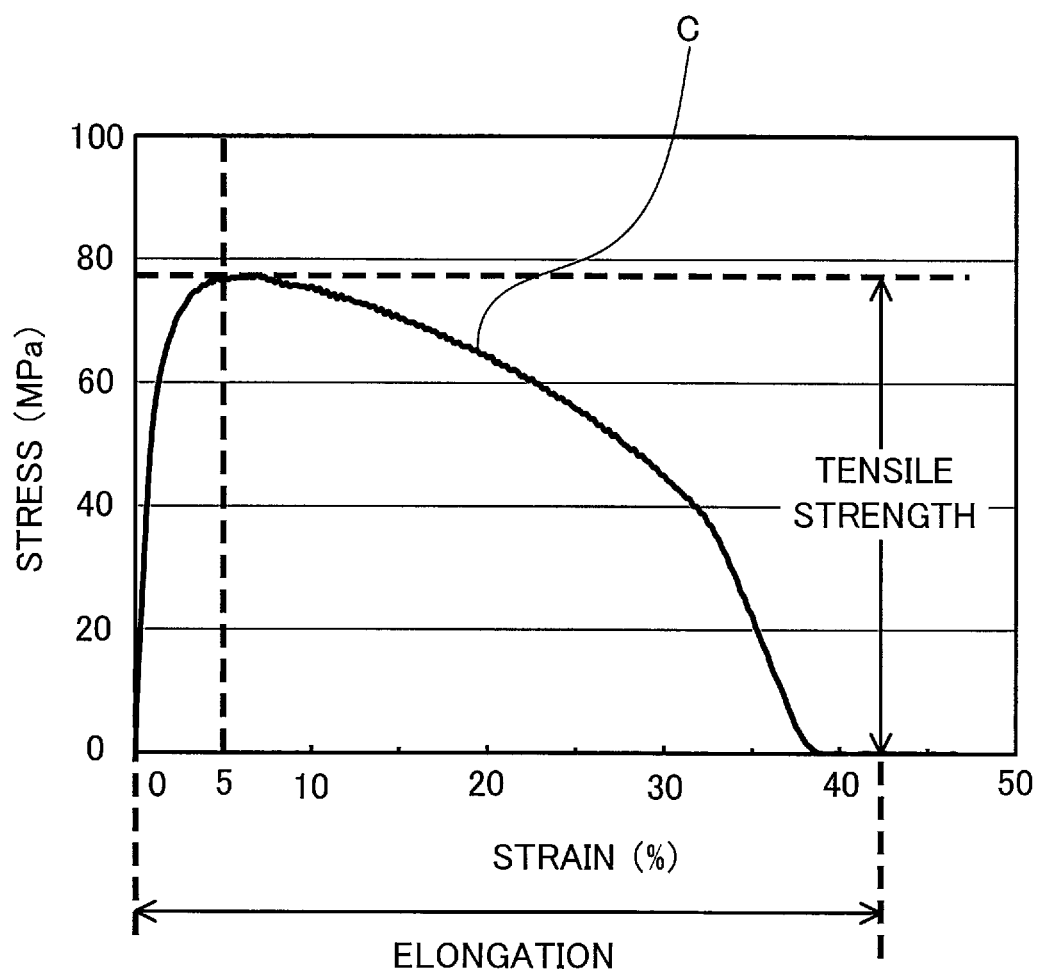
FIG. 4 is an example of a stress-strain curve regarding a solder.

FIG. 4 is an example of a stress-strain curve regarding a solder.

In FIG. 4, a vertical axis (Y axis) indicates a stress (MPa) applied to a target solder and a horizontal axis (X axis) indicates a strain (%) induced in the solder to which the stress is applied.

An external force is applied to the solder made of a determined material and the stress is increased. That is to say, as indicated by a curve C in FIG. 4, as the stress increases from the origin (along the vertical axis), the strain induced in the solder increases from the origin (along the horizontal axis). Deformation in which the solder returns to its original size by removing the applied external force and removing the stress is referred to as elastic deformation. As illustrated in FIG. 4, deformation in which there is a proportional relationship between the stress and the strain is referred to as elastic deformation.

Furthermore, when the stress is applied to the solder, the strain induced in the solder increases (along the horizontal axis) as indicated by the curve C in FIG. 4. However, the stress decreases slowly (along the vertical axis) after it exceeds about 78 MPa. This permanent deformation of the solder is referred to as plastic deformation. When plastic deformation occurs and the strain increases, the solder will soon break (when the strain increases to about 40% in FIG. 4).

The maximum stress and the maximum strain of the solder which deforms in this way are defined as the tensile strength and elongation, respectively, of the solder.

A point at which the change from elastic deformation to plastic deformation is made at the time of applying a stress in this way to the solder is referred to as a yield point.

On the basis of the above curve C, the Young's modulus and 0.2% proof stress of the solder will now be described by the use of FIG. 5.

Figure 5:
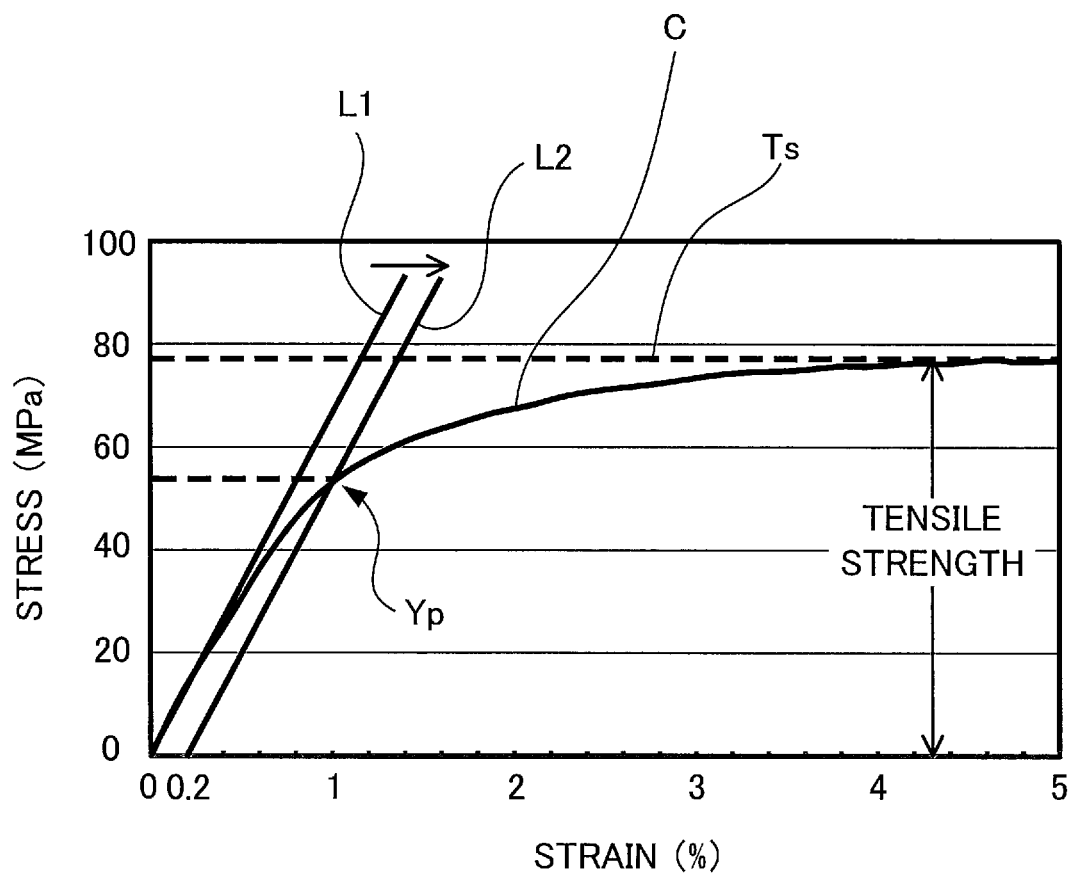
FIG. 5 is a fragmentary enlarged view of the stress-strain curve regarding the solder.

FIG. 5 is a fragmentary enlarged view of the stress-strain curve regarding the solder.

FIG. 5 is obtained by enlarging a portion of the curve C in FIG. 4 in which the strain is in the range of 0 to 5%.

In FIG. 5, a vertical axis (Y axis) indicates a stress (MPa) applied to the target solder and a horizontal axis (X axis) indicates a strain (%) induced in the solder to which the stress is applied. This is the same with FIG. 4.

Furthermore, a dashed line Ts in FIG. 5 indicates tensile strength (see FIG. 4).

First a straight line L1 passing through the origin and tangent to the curve C is drawn. In addition, the slope of the straight line L1 corresponds to the Young's modulus.

Furthermore, the straight line L1 is translated in the direction of the horizontal axis to draw a straight line L2 passing through 0.2% (strain). A point Yp at which the straight line L2 intersects the curve C is a point (yield point) at which the change from elastic deformation to plastic deformation is made, and corresponds to a 0.2% proof stress. The 0.2% proof stress is an index close to the Young's modulus.

As has been described, the Young's modulus corresponds to a stress within the range of the elastic deformation of the solder. Therefore, if a great thermal stress is applied and plastic deformation of the solder occurs, then it is conceivable that there is little correlation between the Young's modulus and a thermal stress created in the solder and that there is no correlation between the Young's modulus and the life checked by a power cycle test. That is to say, there is a case where the life checked by a power cycle test is not properly evaluated on the basis of the Young's modulus of the solder.

On the other hand, the tensile strength corresponds to mechanical strength which takes the elastic deformation and plastic deformation of the solder into consideration.

That is to say, it is conceivable that there is a correlation between the tensile strength (in particular, the tensile strength ratio described later) of the solder and the life checked by a power cycle test performed on the solder.

Results obtained by performing power cycle tests on the semiconductor module 10 in which various solder materials are applied to the first solder 17 and the second solder 18 will now be described.

First examples (practical and reference examples) of the types of solder materials applied to the first solder 17 and the second solder 18 included in the semiconductor module 10 will be described by the use of FIG. 6.

FIG. 6 illustrates examples of the types of solders applied to the semiconductor module according to the embodiment.

In this embodiment, solder materials in practical examples illustrated in FIG. 6 are used as the first solder 17 and the second solder 18 included in the semiconductor module 10.

Sn10Sb and Sn11Sb (practical example 1), Sn11Sb and Sn13Sb (practical example 2), Sn3Sb and Sn5Sb (practical example 3), Sn5Sb and Sn8Sb (practical example 4), Sn8Sb and Sn13Sb (practical example 5), Sn0.7Cu and Sn5Sb (practical example 6), Sn3Sb and Sn13Sb (practical example 7), and Sn0.7Cu and Sn15Sb (practical example 8) are applied as such solder materials to the first solder 17 and the second solder 18 included in the semiconductor module 10.

For example, "Sn10Sb" is a material containing Sn as a main ingredient and 10 wt % Sb. In addition, for example, "Sn10Sb and Sn11Sb" in practical example 1 means that a material having the composition Sn10Sb is used as the first solder 17 and that a material having the composition Sn11Sb is used as the second solder 18.

The solder materials applied to the first solder 17 and the second solder 18 are taken as examples. If the tensile strength of a solder material applied to the first solder 17 is lower than that of a solder material applied to the second solder 18, then other solder materials may be used.

Furthermore, for example, Sn0.7Cu and Sn0.7Cu (reference example 9), Sn5Sb and Sn5Sb (reference example 10), Sn8Sb and Sn8Sb (reference example 11), and Sn13Sb and Sn8Sb (reference example 12) are applied to the first solder 17 and the second solder 18 as reference examples for the above solder materials.

In this embodiment, the tensile strength of the first solder 17 and the second solder 18 which are included in the semiconductor module 10 and to which the solder materials in the above practical examples 1 to 8 and reference examples 9 to 12 are applied is measured in advance to calculate a tensile strength ratio ($\sigma_B$(first)/$\sigma_B$(second):A/B) which is the ratio of the tensile strength of the first solder 17 ($\sigma_B$(first):A) to the tensile strength of the second solder 18 ($\sigma_B$(second):B). Each tensile strength ratio is measured at temperatures of, for example, 25 and 125° C.

A method for measuring tensile strength and a Young's modulus will be described. The tensile strength and Young's modulus of a determined material are found by the use of a tensile tester by measuring a stress-strain curve such as those illustrated in FIGS. 4 and 5. At this time, the tensile strength is a stress corresponding to the largest force applied during a test and the Young's modulus is the slope in a linear area of the stress-strain curve. The measurement is performed in accordance with Japanese Industrial Standards (JIS)-Z2241.

Furthermore, the Young's moduli of the first solder 17 and the second solder 18 which are included in the semiconductor module 10 and to which the solder materials in the above practical examples 1 to 8 are applied are measured in advance in the same way to calculate a Young's modulus ratio (E(first)/E(second)) which is the ratio of the Young's modulus of the first solder 17 (E(first)) to the Young's modulus of the second solder 18 (E(second)). Each Young's modulus ratio is measured at a temperature of, for example, 25° C.

Accordingly, tensile strength ratios (measured at temperatures of 25 and 125° C.) and Young's modulus ratios (measured at a temperature of 25° C.) between the first solder 17 and the second solder 18 to which the solder materials in practical examples 1 to 8 are applied are indicated in FIG. 6. However, a tensile strength ratio (measured at a temperature of 125° C.) between the first solder 17 and the second solder 18 to which the solder materials in practical example 8 are applied is not yet measured. In addition, tensile strength ratios (measured at temperatures of 25 and 125° C.) and Young's modulus ratios (measured at a temperature of 25° C.) between the first solder 17 and the second solder 18 to which the solder materials in reference examples 9 to 12 are applied are indicated in FIG. 6.

Results obtained by performing power cycle tests on the semiconductor module 10 in which the solder materials in practical examples 1 to 8 and reference examples 9 to 12 indicated in FIG. 6 are applied to the first solder 17 and the second solder 18 will now be described by the use of FIGS. 7 and 8.

Figure 7:
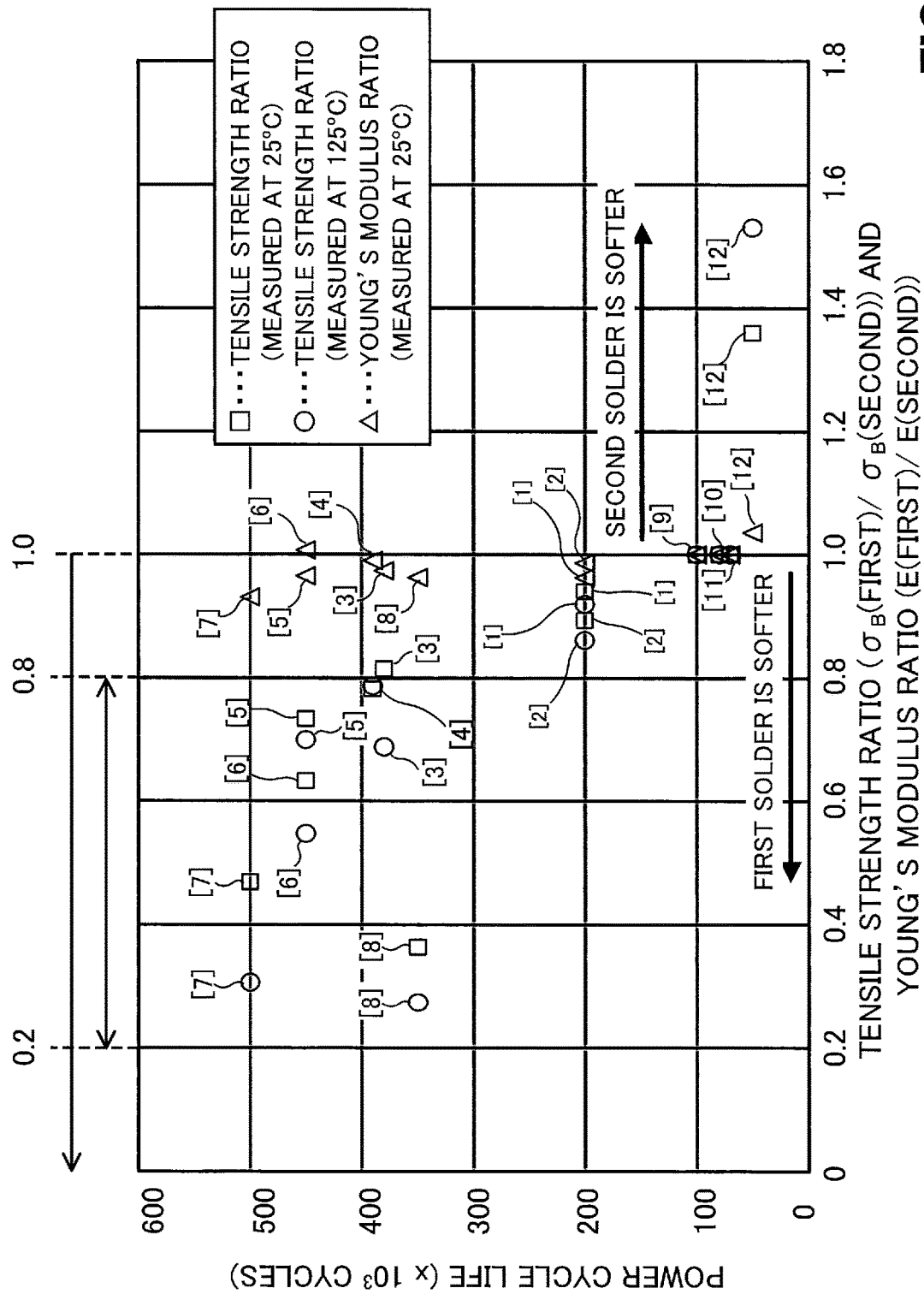
FIG. 7 illustrates the results of power cycle tests regarding the physical property values (tensile strength ratios and Young's modulus ratios) of the solders applied to the semiconductor module according to the embodiment.

FIG. 7 illustrates the results of power cycle tests regarding the physical property values (tensile strength ratios and Young's modulus ratios) of the solders applied to the semiconductor module according to the embodiment.

In FIG. 7, a horizontal axis indicates a tensile strength ratio ($\sigma_B$(first)/$\sigma_B$(second):A/B), which is the ratio of the tensile strength of the first solder 17 to the tensile strength of the second solder 18, and a Young's modulus ratio (E(first)/E(second)), which is the ratio of the Young's modulus of the first solder 17 to the Young's modulus of the second solder 18. In FIG. 7, a vertical axis indicates a result obtained by a power cycle test (power cycle life ($\times 10^3$ cycles)).

Furthermore, in FIG. 7, a tensile strength ratio measured at a temperature of 25° C. is indicated by "□" (square mark) and a tensile strength ratio measured at a temperature of 125° C. is indicated by "○" (circle mark). In addition, a Young's modulus ratio measured at a temperature of 25° C. is indicated by "Δ" (triangle mark). Moreover, [1] to [8] and [9] to [12] with which points in FIG. 7 are marked represent the numbers of practical examples 1 to 8 and reference examples 9 to 12 respectively. "○" and "□" are equal in value for [4] and "○", "□", and "Δ" are equal in value for [9], [10], and [11].

With the semiconductor module 10, usually the semiconductor element 14 generates heat and the temperature rises and falls, according to a used operating condition. A thermal stress is applied because of this change in the temperature to the internal structure of the semiconductor module 10. As a result, fatigue or deterioration of the semiconductor module 10 progresses. By performing a power cycle test, the life of the semiconductor module 10 which fatigues or deteriorates is evaluated.

With such a power cycle test, for example, a thermal stress may be created in the semiconductor module 10 by turning electricity on and off until it breaks.

To be concrete, the temperature of the semiconductor element 14 of the semiconductor module 10 is raised from 40° C. to 175° C. and then is lowered to 40° C. This process is counted as one cycle. Furthermore, the number of cycles after which an abnormality in the electrical property occurs, after which an increase in the thermal resistance takes place, or after which a crack appears is considered as a power cycle life.

By performing such a power cycle test, the power cycle life (reliability) of each of a solder bonding portion (first solder 17) situated under the lead terminal 15 and a solder bonding portion (second solder 18) under the semiconductor element 14 is evaluated.

In this embodiment, such a power cycle test is performed on the semiconductor module 10 including the first solder 17 and the second solder 18 to which the solder materials in practical examples 1 to 8 and reference examples 9 to 12 indicated in FIG. 6 are applied.

As can be seen from FIG. 7, according to the results of this power cycle test, the power cycle life of the semiconductor module 10 including the first solder 17 and the second solder 18 to which the solder materials in practical examples 1 to 8 other than reference examples 9 to 12 are applied lengthens at measurement temperatures higher than or equal to 25° C. (both at a measurement temperature of 25° C. and at a measurement temperature of 125° C.).

That is to say, if the tensile strength ratio between solder materials is lower than 1 as in practical examples 1 to 8, in other words, if the first solder 17 is softer than the second solder 18, then the power cycle life improves. To be concrete, the power cycle life is two to five times the power cycle life realized in the case of the tensile strength ratio between solder materials being 1. On the other hand, if the tensile strength ratio between solder materials is higher than or equal to 1 as in reference examples 9 to 12, in other words, if the second solder 18 is softer than the first solder 17, then the power cycle life shortens.

If the solder materials in practical examples 1 to 8 are applied to the first solder 17 and the second solder 18, then the first solder 17 is softer than the second solder 18. As a result, even if the lead terminal 15 which thermally expands or contracts because of heat generated by the semiconductor element 14 expands or contracts toward the semiconductor element 14, a stress applied by the lead terminal 15 is absorbed and relaxed by the first solder 17. This prevents a crack from appearing in the surface electrode of the semiconductor element 14 and therefore prevents damage to the surface electrode of the semiconductor element 14. It is conceivable that as a result, the reliability of the surface electrode of the semiconductor element 14 will improve.

Accordingly, it turns out that when the tensile strength ratio ($\sigma_B$(first)/$\sigma_B$(second):A/B) which is the ratio of the tensile strength of the first solder 17 to the tensile strength of the second solder 18 is lower than 1 (when the first solder 17 is softer than the second solder 18), the power cycle life lengthens.

Furthermore, if the tensile strength ratio (A/B) which is the ratio of the tensile strength of the first solder 17 to the tensile strength of the second solder 18 is lower than or equal to 0.8, then the power cycle life is four to five times the power cycle life realized in the case of the tensile strength ratio between solder materials being 1. That is to say, it turns out that a tensile strength ratio (A/B) in this range is more desirable.

In addition, if the tensile strength ratio (A/B) which is the ratio of the tensile strength of the first solder 17 to the tensile strength of the second solder 18 is lower than 1 and higher than or equal to 0.2, then the power cycle life improves. From the tendency of the measured values in FIG. 7, it turns out by extrapolation toward a low tensile strength ratio that if the tensile strength ratio (A/B) is higher than or equal to at least 0.2, the power cycle life improves. It is more desirable that the tensile strength ratio (A/B) be lower than or equal to 0.8 and higher than or equal to 0.4. In this case, the power cycle life is four to five times the power cycle life realized in the case of the tensile strength ratio between solder materials being 1. Therefore, tensile strength ratios (A/B) in the range of 0.4 to 0.8 are more desirable.

In addition, a tensile strength ratio at 25° C. (room temperature) has a great influence on the power cycle life. It turned out that not only a tensile strength ratio at 25° C. but also a tensile strength ratio at a high temperature of 125° C. displays this tendency. Tensile strength itself at 125° C. (high temperature) is lower than tensile strength at 25° C. and is about one fourth to one third of the tensile strength at 25° C. However, if a tensile strength ratio is low, then the power cycle life is long. It turns out from these viewpoints that the relative tensile strength (tensile strength ratio) of the first solder 17 to the second solder 18 is important not only at room temperature but also at a high temperature. That is to say, if the first solder 17 and the second solder 18 are disposed so as to sandwich a heating element, such as the semiconductor element 14, between them and if a tensile strength ratio which is the ratio of the tensile strength of the first solder 17 to the tensile strength of the second solder 18 is low, then the first solder 17 whose tensile strength is low has the function of stress relaxation. Therefore, it is conceivable that the first solder 17 prevents a crack or the like from appearing.

There is a need for a tensile strength ratio to meet the above relationship at a temperature between 25 and 125° C. Accordingly, it is desirable that a tensile strength ratio at least at 25° C. (room temperature) be lower than 1. It is more desirable that a tensile strength ratio be lower than or equal to 0.8. In addition, there is at least one combination of the first solder 17 and the second solder 18 by which a tensile strength ratio becomes lower than 1 at temperatures higher than or equal to 25° C. (room temperature).

Furthermore, if as stated above, the first solder 17 and the second solder 18 are Sn—Sb based solders, then the Sb content of the first solder 17 is lower than that of the second solder 18. In this case, a tensile strength ratio is lower than 1 and therefore the first solder 17 and the second solder 18 are desirable.

In addition, the first solder 17 and the second solder 18 may be an Sn—Cu based solder and an Sn—Sb based solder respectively.

As indicated in FIG. 6, it is hard to say that there is a correlation between a Young's modulus ratio (E(first)/E(second)) in each of practical examples 1 to 8 and the power cycle life. As stated above, the reason for this is as follows. The Young's modulus corresponds to a stress within the range of the elastic deformation of a solder. Therefore, if a great thermal stress is applied to the solder and plastic deformation of the solder occurs, then it is conceivable that there is no correlation between the Young's modulus and a thermal stress. As a result, it is conceivable that there is no correlation between a Young's modulus ratio in each of practical examples 1 to 8 and the power cycle life.

The tensile strength itself of each of the first solder 17 and the second solder 18 relative to the power cycle life will now be described by the use of FIG. 8.

FIG. 8 illustrates the result of power cycle tests regarding the tensile strength of the solders applied to the semiconductor module according to the embodiment.

FIG. 8 indicates the tensile strength (MPa) (measured at a temperature of 25° C.) of each of the first solder 17 and the second solder 18 to which the solder materials in the above practical examples 1 to 8 and reference examples 9 to 12 are applied and the power cycle life ($\times 10^3$ cycles) checked at that time.

In particular, in the case of each of practical examples 1 to 8, the tensile strength of each of the first solder 17 and the second solder 18 may increase or decrease even if the power cycle life improves. That is to say, it is conceivable that there is no definite correlation between the tensile strength itself of each of the first solder 17 and the second solder 18 in each of practical examples 1 to 8 and the power cycle life.

It is desirable that the tensile strength of each of the first solder 17 and the second solder 18 be higher than or equal to 18 MPa at a temperature of 25° C. (room temperature) from the viewpoint of reliability regardless of what solder material is used. It is more desirable that the tensile strength of each of the first solder 17 and the second solder 18 be higher than or equal to 25 MPa at a temperature of 25° C. (room temperature) from the viewpoint of reliability regardless of what solder material is used. The reason for this is that a thermal stress does not cause a crack to appear in the solder itself or cause the solder itself to deform significantly.

The above semiconductor module 10 includes the semiconductor element 14 having one surface and the other surface opposite to the one surface, the lead terminal 15 connected electrically and thermally to the semiconductor element 14, and the first solder 17 which bonds the lead terminal 15 and the one surface of the semiconductor element 14 together. Furthermore, the semiconductor module 10 includes the circuit layer 13b over which the semiconductor element 14 is disposed and the second solder 18 which bonds the other surface of the semiconductor element 14 and the circuit layer 13b together. At this time the following inequality holds.

$$\text{tensile strength ratio} < 1$$

where the tensile strength of the first solder 17 of the semiconductor module 10 is A, the tensile strength of the second solder 18 of the semiconductor module 10 is B, and the tensile strength ratio is A/B.

As a result, even if the lead terminal 15 which thermally expands because of heat generated by the semiconductor element 14 expands or contracts toward the semiconductor element 14, a stress applied by the lead terminal 15 is absorbed and relaxed by the first solder 17. This prevents a crack from appearing in the surface electrode of the semiconductor element 14 and therefore prevents damage to the surface electrode of the semiconductor element 14. It is conceivable that as a result, the reliability of the surface electrode of the semiconductor element 14 will improve.

Accordingly, when a tensile strength ratio which is the ratio of the tensile strength of the first solder 17 to the tensile strength of the second solder 18 is lower than 1 (when the first solder 17 is softer than the second solder 18), the power cycle life lengthens.

With the semiconductor module having the above structure, a value obtained by dividing the tensile strength of the first solder to which a stress is directly applied by an external connection terminal by the tensile strength of the second solder to which a stress is directly applied by a metal substrate is made smaller than 1. This reduces a stress applied to the surface electrode of the semiconductor element. As a result, the effect of improving the reliability of the surface electrode of the semiconductor element is achieved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module comprising:
a semiconductor element having one surface and another surface opposite to the one surface;
an external connection terminal connected electrically and thermally to the semiconductor element;
a first solder which bonds the external connection terminal and the one surface of the semiconductor element together, the first solder having a first tensile strength;
a metal substrate over which the semiconductor element is disposed; and
a second solder which bonds said another surface of the semiconductor element and the metal substrate together, the second solder having a second tensile strength, a tensile strength ratio of the first tensile strength to the second tensile strength being less than 40.8 and greater than 0.2.

2. The semiconductor module according to claim 1, wherein when the tensile strength ratio is less than 1, a temperature is greater than or equal to 25° C. and less than or equal to 125° C.

3. The semiconductor module according to claim 1, wherein the first solder is an Sn—Cu based solder and the second solder is an Sn—Sb based solder.

4. The semiconductor module according to claim 1, wherein a bonding area between the external connection terminal and the semiconductor element is larger than or equal to 20 percent and smaller than or equal to 70 percent of a bonding area between the semiconductor element and the metal substrate.

5. The semiconductor module according to claim 1, wherein the semiconductor element is an RC-IGBT.

6. The semiconductor module according to claim 1, wherein the second solder is Sn—Ag—Cu based solder.

7. The semiconductor module according to claim 1, wherein the first solder and the second solder are Sn—Sb based solders.

8. The semiconductor module according to claim 7, wherein an Sb content of the first solder is lower than an Sb content of the second solder.

9. A semiconductor module comprising:
a semiconductor element having a first surface and a second surface;
a lead terminal coupled to the semiconductor element;
a first solder which bonds the lead terminal and the first surface of the semiconductor element, the first solder having a first tensile strength;
a laminated board; and
a second solder which bonds the second surface of the semiconductor element and the laminated board, the second solder having a second tensile strength, a tensile strength ratio of the first tensile strength to the second tensile strength being less than 0.8 and greater than 0.2.

10. The semiconductor module according to claim 9, wherein the laminated board includes a metal plate.

11. The semiconductor module according to claim 10, wherein the first solder and the second solder are Sn—Sb solders.

12. The semiconductor module according to claim 11, wherein the Sb content of the first and second solders, is greater than or equal to 2.8 weight percent and less than or equal to 13 weight percent.

13. The semiconductor module according to claim 9, wherein the laminated board includes a circuit layer, an insulating board and a metal plate laminated together.

14. The semiconductor module according to claim 13, wherein the circuit layer comprises at least two circuit layers.

15. The semiconductor module according to claim 9, further comprising a cooler coupled to the laminated board, wherein the laminated board conducts heat generated by the semiconductor element to the cooler.

* * * * *

UNITED STATES PATENT AND TRADEMARK OFFICE
CERTIFICATE OF CORRECTION

PATENT NO. : 10,916,491 B2
APPLICATION NO. : 16/120754
DATED : February 9, 2021
INVENTOR(S) : Ryoichi Kato et al.

It is certified that error appears in the above-identified patent and that said Letters Patent is hereby corrected as shown below:

In the Claims

Column 13, Line 27:
In Claim 1, delete "40.8" and insert -- 0.8 --, therefor.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*